United States Patent
Nurani et al.

(10) Patent No.: US 11,187,992 B2
(45) Date of Patent: Nov. 30, 2021

(54) PREDICTIVE MODELING OF METROLOGY IN SEMICONDUCTOR PROCESSES

(71) Applicant: Applied Materials, Inc., Santa Clara, CA (US)

(72) Inventors: Raman K. Nurani, Chennai (IN); Anantha R. Sethuraman, Palo Alto, CA (US); Koushik Ragavan, Chennai (IN)

(73) Assignee: Applied Materials, Inc., Santa Clara, CA (US)

( * ) Notice: Subject to any disclaimer, the term of this patent is extended or adjusted under 35 U.S.C. 154(b) by 564 days.

(21) Appl. No.: 16/151,035

(22) Filed: Oct. 3, 2018

(65) Prior Publication Data

US 2019/0121237 A1    Apr. 25, 2019

Related U.S. Application Data

(60) Provisional application No. 62/575,886, filed on Oct. 23, 2017.

(51) Int. Cl.
*G03F 7/20* (2006.01)
*G06N 7/08* (2006.01)
*H01L 21/66* (2006.01)

(52) U.S. Cl.
CPC .......... *G03F 7/705* (2013.01); *G03F 7/70508* (2013.01); *G06N 7/08* (2013.01); *H01L 22/20* (2013.01); *H01L 22/12* (2013.01)

(58) Field of Classification Search
CPC ....... G06F 30/39; G06F 30/398; H01L 22/20; H01L 22/12; H01L 21/67276; G03F 7/705; G03F 7/70508; G03F 7/70616; G06N 7/08
See application file for complete search history.

(56) References Cited

U.S. PATENT DOCUMENTS 6,913,938 B2 *  7/2005  Shanmugasundram ..................... G05B 19/19
                                                               438/16
6,965,895 B2 * 11/2005  Smith .................... G06Q 10/06
(Continued)

FOREIGN PATENT DOCUMENTS

EP         0584676 A1 *  3/1994  ........ H01J 37/32963
KR   20180089911 A  *  8/2018  ........... H01J 37/226
(Continued)

OTHER PUBLICATIONS

Lin et al.; "Test problems, reference models and fab simulation"; 2017 Winter Simulation Conference (WSC); Conference Paper | Publisher: IEEE (Year: 2017).*

*Primary Examiner* — Helen Rossoshek
(74) *Attorney, Agent, or Firm* — Patterson + Sheridan, LLP

(57) ABSTRACT

Implementations described herein generally relate to improving silicon wafer manufacturing. In one implementation, a method includes receiving data from one or more manufacturing tools about a manufacturing process of a silicon wafer. The method further includes determining, based on the data, predictive information about a quality of the silicon wafer. The method further includes providing the predictive information to a manufacturing system, wherein the predictive information is used to determine whether to take corrective action.

18 Claims, 5 Drawing Sheets

(56) References Cited

U.S. PATENT DOCUMENTS

| | | | | |
|---|---|---|---|---|
| 7,201,936 | B2* | 4/2007 | Schwarm | G05B 19/41865 |
| | | | | 427/8 |
| 7,454,312 | B2* | 11/2008 | Weiher | G05B 19/41875 |
| | | | | 702/179 |
| 7,962,867 | B2* | 6/2011 | White | H01L 21/3212 |
| | | | | 716/54 |
| 8,001,516 | B2* | 8/2011 | Smith | G06F 30/39 |
| | | | | 716/136 |
| 8,229,587 | B2* | 7/2012 | Shieh | G05B 19/41885 |
| | | | | 700/112 |
| 9,299,623 | B2* | 3/2016 | Baseman | H01L 22/20 |
| 10,140,394 | B2* | 11/2018 | Kommisetti | G06F 30/20 |
| 10,274,533 | B1* | 4/2019 | Visvardis | G01R 31/26 |
| 10,579,041 | B2* | 3/2020 | Nurani | H01L 22/12 |
| 10,579,769 | B2* | 3/2020 | Nurani | G06T 7/0006 |
| 2016/0275453 | A1* | 9/2016 | Powers | G06F 3/0482 |
| 2016/0342729 | A1* | 11/2016 | Visvardis | G06F 30/23 |
| 2017/0308644 | A1* | 10/2017 | van Rooyen | G16B 50/00 |
| 2018/0060453 | A1* | 3/2018 | Shah | G06F 30/30 |
| 2018/0300737 | A1* | 10/2018 | Bledsoe | G06F 16/248 |
| 2019/0057175 | A1* | 2/2019 | Victory | G06F 30/367 |
| 2019/0171181 | A1* | 6/2019 | Nurani | H01L 21/67253 |
| 2020/0082523 | A1* | 3/2020 | Leung | H01L 22/20 |

FOREIGN PATENT DOCUMENTS

| | | | | | |
|---|---|---|---|---|---|
| KR | 20190015243 | A | * | 2/2019 | H01L 22/20 |
| WO | WO-2018099742 | A1 | * | 6/2018 | G03F 7/705 |

* cited by examiner

PREDICTIVE MODELING OF METROLOGY IN SEMICONDUCTOR PROCESSES

CROSS-REFERENCE TO RELATED APPLICATION

This application claims the benefit of U.S. Provisional Application No. 62/575,886, filed Oct. 23, 2017, which is hereby incorporated by reference in its entirety.

BACKGROUND

Field

Implementations described herein generally relate to using sensor inputs to predict end results of manufacturing processes based on virtual metrology.

Description of the Related Art

Manufacturing silicon wafers involves a series of steps, which may include lithography, etching, deposition, and planarization, each of which may be repeated for a plurality of layers. Lithography generally involves an alignment process performed by a lithography tool (e.g., run by precise motors on a stage) which ensures correct alignment of the various layers with one another. Typically, overlay marks are utilized in the layers to assist in the alignment of features in different layers. The quality of the resulting wafer may be affected substantially by variations which occur during the manufacturing process, such as misalignment.

Generally, wafers are inspected (e.g., by metrology tools) after the manufacturing process is complete in order to identify defects and determine the overall quality of the wafers. Due to the large numbers of wafers which may manufactured (e.g., hundreds of thousands in a month), waiting to make quality determinations until each wafer can be individually inspected after the fact is not always efficient or feasible. Furthermore, basing determinations on inspection of only a small representative subset of wafers may result in inaccurate determinations.

Therefore, there is a need in the art for improved techniques of determining the quality of wafers which result from manufacturing processes.

SUMMARY

Implementations described herein generally relate to improving silicon wafer manufacturing. In one embodiment, a method includes receiving data from one or more manufacturing tools about a manufacturing process of a silicon wafer. The method further includes determining, based on the data, predictive information about a quality of the silicon wafer. The method further includes providing the predictive information to a manufacturing system, wherein the predictive information is used to determine whether to take corrective action.

In another implementation, a computer system is provided, which comprises a memory and a processor configured to perform a method for improving silicon wafer manufacturing. In one embodiment, the method includes receiving data from one or more manufacturing tools about a manufacturing process of a silicon wafer. The method further includes determining, based on the data, predictive information about a quality of the silicon wafer. The method further includes providing the predictive information to a manufacturing system, wherein the predictive information is used to determine whether to take corrective action.

In yet another implementation, a non-transitory computer-readable medium is provided, which comprises instructions to perform a method for improving silicon wafer manufacturing. In one embodiment, the method includes receiving data from one or more manufacturing tools about a manufacturing process of a silicon wafer. The method further includes determining, based on the data, predictive information about a quality of the silicon wafer. The method further includes providing the predictive information to a manufacturing system, wherein the predictive information is used to determine whether to take corrective action.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
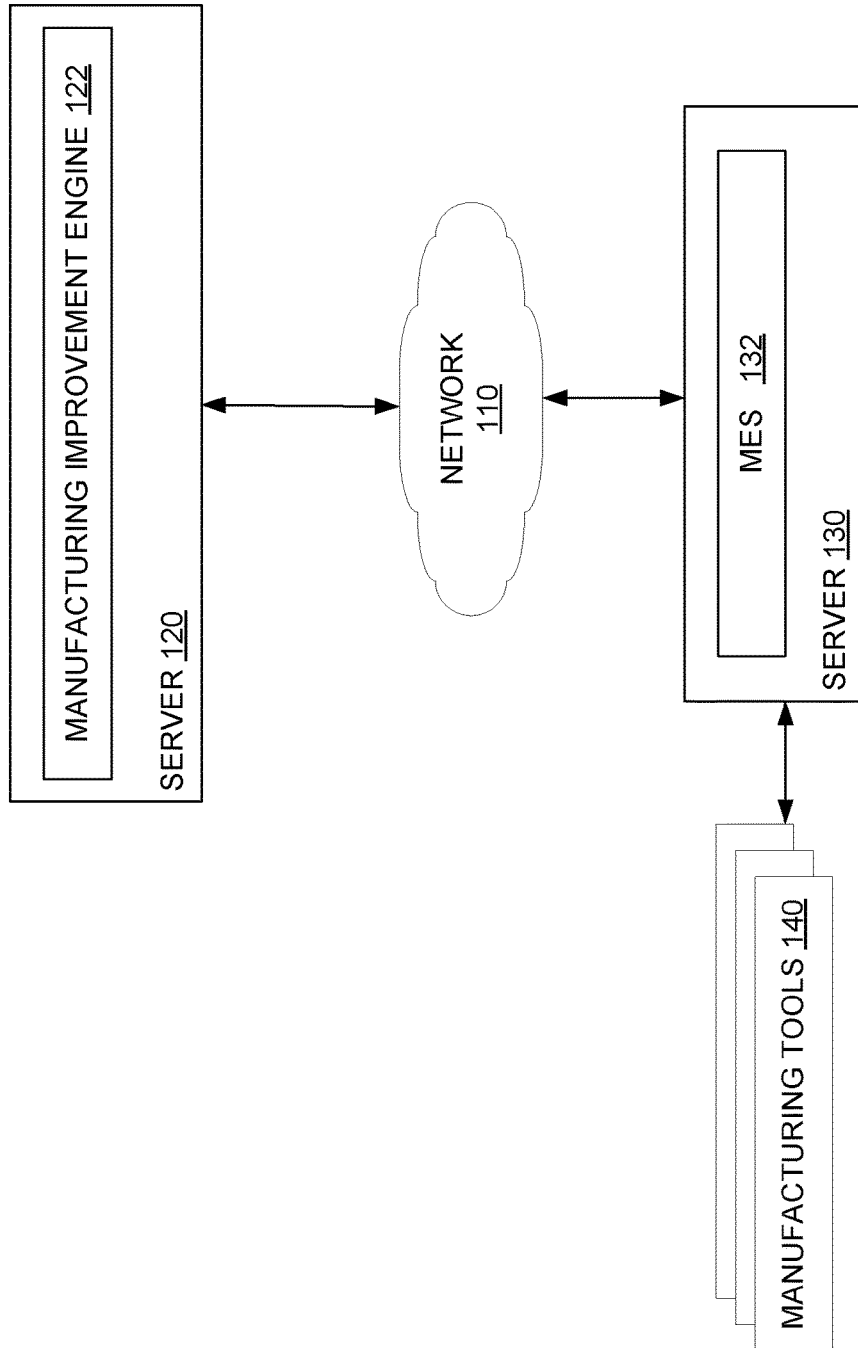
FIG. 1 depicts a network environment in which embodiments of the present disclosure may be implemented.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods for predictive modeling of metrology in semiconductor processes. Certain details are set forth in the following description and in FIGS. 1-5 to provide a thorough understanding of various implementations of the disclosure. Other details describing well-known structures and systems often associated with plasma etching are not set forth in the following disclosure to avoid unnecessarily obscuring the description of the various implementations.

Many of the details, dimensions, components, and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

In semiconductor fabrication, each step must be performed with a sufficient level of precision so that the resulting product works correctly. Certain defects which occur during the lithography, etching, deposition, or planarization steps may require significant corrective actions in order to rework the wafer. For example, if a substantial misalignment occurs during lithography, in certain cases the wafer must be stripped and lithography must be redone in order to correct the defect. Correcting these defects may result in substantial increases in time and cost. Various parameters of the wafers (e.g., thickness, optical reflective index, absorption index, strength, critical dimension variation across the wafer, and the like) may need to be within acceptable windows in order for the completed wafer to be of sufficient quality for use. Problems with one or more parameters may require corrective action to be taken with respect to either an individual wafer or aspects of the manufacturing process. Checking all of these parameters for every wafer after the manufacturing process is complete is inefficient and costly. Sometimes, a representative sample of wafers is checked using metrology tools which measure various parameters of the wafers. Because only a representative sample is checked, however, this method of determining the quality of large numbers of wafers can be inaccurate. Therefore, there is a need for a more intelligent and efficient way to determine the quality of a large number of manufactured wafers.

Embodiments of the present disclosure involve gathering data about various processes and parameters of wafers during the manufacturing process from various manufacturing tools. In some embodiments, the manufacturing tools are associated with a manufacturing execution system (MES). The data may include, for example, time-series data about the behavior of various wafer parameters (e.g., thickness, optical reflective index, absorption index, strength, overlay and alignment data, critical dimension variation across the wafer, and the like) and tool parameters throughout the manufacturing process. The data may be aggregated and analyzed at a central location, such as a server, and used to make predictive determinations about wafer quality. For example, the server may use fundamental statistical processes or stochastic-based analyses of time-series data about a particular parameter of a wafer in order to predict the final quality of that parameter at the end of the manufacturing process. In some embodiments, the server may make predictive determinations about the overall quality of the wafer based on predictions about the final quality of a variety of wafer parameters.

Predictive information may be provided from the server to the MES so that the predictive information can be analyzed by engineers and so that corrective action may be taken as needed regarding problems which are identified. The server may also determine appropriate corrective action to be taken based on analysis of the data (e.g., based on identifying correlations between tool parameters and wafer parameters throughout the process), and provide instructions to perform corrective action. In some embodiments, the MES may automatically take corrective action (e.g., recalibrating or adjusting a parameter of a lithography tool, redoing a portion of the manufacturing process for a wafer, and the like) based on the predictive information. In certain embodiments, if the predictive information identifies a problem with one or more parameters of a wafer, the problem may be verified by analyzing the wafer (e.g., using metrology tools). If the problem is confirmed by analyzing the wafer, corrective action may then be taken (e.g., manually or automatically by the MES).

Embodiments of the present disclosure may allow for efficient and accurate predictions about wafer quality and yield. Furthermore, embodiments may allow for effective determinations to be made regarding improvements with respect to such processes as thin film deposition, etching, and implant processes in order to achieve predictable process windows and optimal thin film properties.

FIG. 1 depicts a network environment 100 in which embodiments of the present disclosure may be implemented. As shown, network environment 100 includes a server 120 which is connected via network 110 to another server 130 which is connected to one or more manufacturing tools 140. Network 110 may, for example, comprise the Internet. In another embodiment, manufacturing tools 140 are also connected directly to server 120.

Server 120 may comprise a computing device such as a rack server, desktop or laptop computer, mobile phone, tablet, and the like. As shown, server 120 comprises a manufacturing improvement engine 122, which may perform operations described herein related to making determinations and predictions regarding wafer quality, corrective actions, and process improvements. For example, manufacturing improvement engine 122 may analyze process and wafer information received from MES 132 or directly from manufacturing tools 140 (e.g., thickness, optical reflective index, absorption index, strength, overlay and alignment data, critical dimension variation across the wafer, and the like) in order to make predictive determinations about wafer quality, corrective actions, and process improvements.

For example manufacturing improvement engine 122 may receive time-series data from MES 132 representing the behavior of various parameters of a wafer and manufacturing tools throughout the manufacturing process (e.g., wafer parameters may be captured by sensors associated with manufacturing tools 140). Manufacturing improvement engine 122 may analyze the data using statistical processes in order to predict the final quality of the wafer. In some embodiments, manufacturing improvement engine 122 may convert the data into a parameter-agnostic and measurement-unit-agnostic space (e.g., a generic format based on relative differences) before performing predictive calculations. Calculations may involve the use of stochastic-based processes. Once manufacturing improvement engine 122 predicts the quality of one or more parameters, the results of the predictive calculations may be converted back to the original parameter-specific space (e.g., the original measurement units for each parameter). Manufacturing improvement engine 122 may provide predictive information to MES 132. In some embodiments, manufacturing improvement engine 122 may also determine corrective action to be taken with respect to processes or individual wafers based on the data. For example, manufacturing improvement engine 122 may identify a correlation between a certain wafer parameter problem and a tool parameter, and determine that the tool parameter should be adjusted by a certain amount. Furthermore, manufacturing improvement engine 122 may determine actions to be performed on a wafer to bring one or more predicted parameters into an acceptable range (e.g., correcting overlay marks, stripping and recoating the wafer, and the like).

Predictive information regarding wafer quality with respect to parameters may allow engineers or MES 132 to improve the manufacturing process (e.g., lithography, etching, deposition, and planarization may be improved to achieve predictable properties).

Server 130 may comprise a computing device such as a rack server, desktop or laptop computer, mobile phone, tablet, and the like. As shown, server 120 comprises an MES 132, which may perform operations described herein related to managing the manufacturing of silicon wafers. For example, MES 132 may coordinate processes performed by a plurality of manufacturing tools 140, and may collect data from these tools (e.g., tool parameters, thickness, optical reflective index, absorption index, strength, overlay and alignment data, critical dimension variation across the wafer, and the like). In some embodiments, the data may be time-series data which represents the behavior of parameters over time as manufacturing processes are performed. MES 132 may provide this information to manufacturing improvement engine 122 (e.g., over network 110), which may analyze the information and provide predictive information to manufacturing improvement engine 122 in return. In some embodiments manufacturing improvement engine 122 may provide instructions to MES 132 regarding corrective action to take with respect to an individual defect, a manufacturing tool 140, or other aspects of the manufacturing process. In certain embodiments, MES 132 automatically takes corrective action, such as by instructing individual manufacturing tools 140 to perform certain tasks (e.g., instructing a lithography tool to strip and recoat a wafer in order to correct an alignment defect or instructing a deposition tool to alter one or more parameters).

Manufacturing tools 140 may comprise one or more tools which perform processes related to manufacturing silicon wafers. For example, manufacturing tools 140 may include lithography tools, etching tools, deposition tools, and planarization tools. Manufacturing tools 140 may communicate with MES 132 in order to receive instructions and provide data about, for example, wafers, defects, parameters, and the manufacturing process (e.g., time-series data representing the values of parameters of wafers captured by sensors over time during manufacturing).

Figure 2:
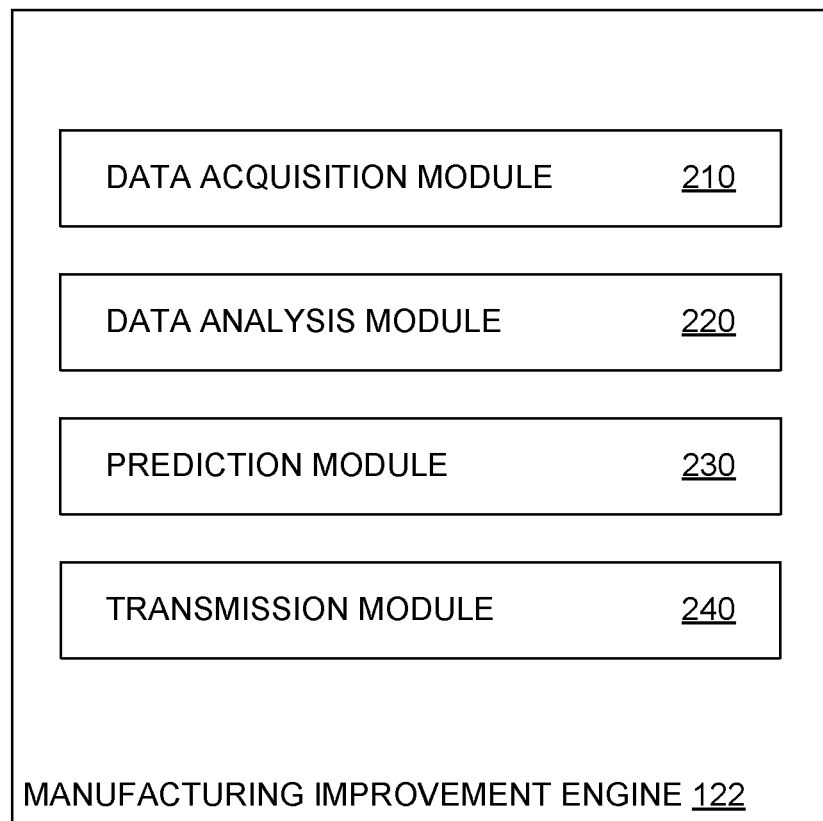
FIG. 2 illustrates components of a manufacturing improvement engine according to embodiments of the present disclosure.

FIG. 2 illustrates components of manufacturing improvement engine 132 according to embodiments of the present disclosure.

As shown, manufacturing improvement engine 122 includes a data acquisition module 210, which may acquire data from MES 132 (e.g., over network 110). In alternative embodiments, data acquisition module 210 acquires data directly from manufacturing tools 140. Manufacturing improvement engine 122 further includes a data analysis module 220, which may analyze data received from MES 132 (e.g., using statistical processes). In some embodiments, data analysis module 220 converts data into a parameter-agnostic and measurement-unit-agnostic space before performing calculations, and then converts the results of the calculations back into the original parameter-specific space for each parameter. Manufacturing improvement engine 122 further includes a prediction module 230, which may make predictions about wafer quality and other aspects of the manufacturing process (e.g., corrective actions and process improvements) based on determinations made by data analysis module 220. Data analysis module 220 and prediction module 230 may, for example, work together to make determinations based on fundamental statistical processes and stochastic-based analyses of time-series data received from MES 132. In some embodiments, prediction module 230 aggregates quality predictions of a plurality of wafer parameters in order to predict the overall quality of a wafer. Manufacturing improvement engine 122 further includes a transmission module 240, which may transmit data such as predictive information and corrective instructions to MES 132 (e.g., over network 110) or to other destinations.

It is noted that the components shown in FIG. 2 are merely exemplary, and the operations described herein may be implemented by any combination of local or distributed components.

Figure 3:
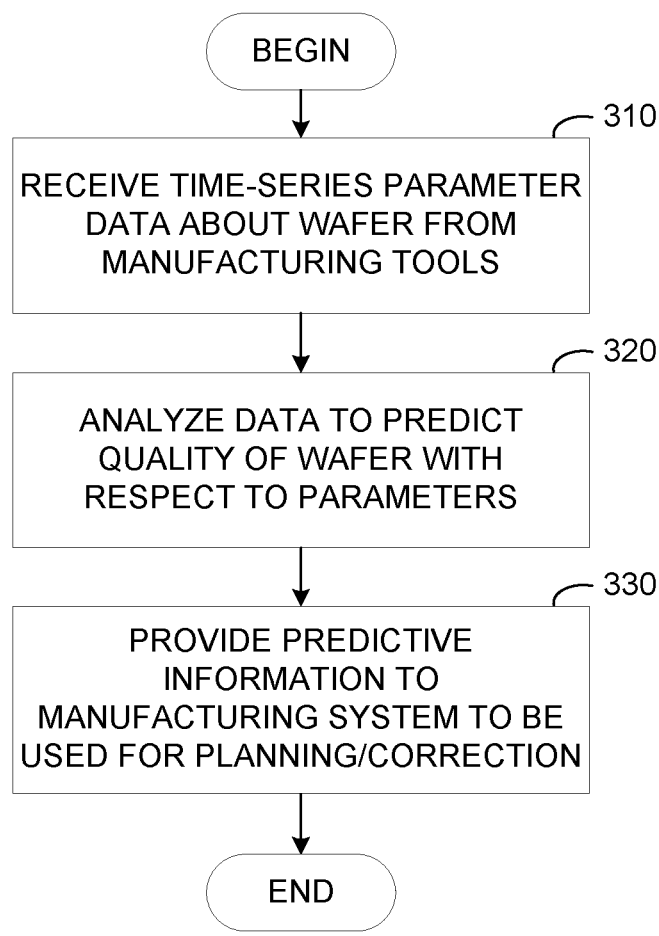
FIG. 3 illustrates example operations for improving silicon wafer manufacturing according to embodiments of the present disclosure.

FIG. 3 illustrates example operations 300 for improving manufacturing of silicon wafers, according to embodiments of the present disclosure. Operations 300 may be performed, for example, by manufacturing improvement engine 122.

At 310, manufacturing improvement engine 122 receives time-series data representing the behavior of a variety of parameters of a wafer and of manufacturing tools throughout the manufacturing process. For example, manufacturing improvement engine 122 may receive information from MES 132, acquired from one or manufacturing tools 140, about parameters related to the manufacturing of a wafer (e.g., tool parameters, thickness, optical reflective index, absorption index, strength, overlay and alignment data, critical dimension variation across the wafer, and the like). In another embodiment, manufacturing improvement engine 122 receives the data directly from manufacturing tools 140.

At 320, manufacturing improvement engine 122 analyzes the data in order to predict the quality of the wafer with respect to various wafer parameters. For example, manufacturing improvement engine 122 may use fundamental statistical processes or stochastic-based analyses in order to predict the final values of the parameters, which are used to predict the quality of the wafer. In some embodiments, manufacturing improvement engine 122 also determines corrective action to be taken (e.g., by identifying correlations between wafer parameters and tool parameters), such as modifying a tool parameter or correcting an aspect of the wafer (e.g., correcting an alignment defect).

At 330, manufacturing improvement engine 122 provides the predictive information determined at 320 to MES 132 (or to another system) so that it can be analyzed by professionals and/or used to take corrective action. In some embodiments, MES 132 may automatically take corrective action based on the predictive information (e.g., based on instructions for corrective action included with the predictive information). In some embodiments, MES 132 (or, alternatively, manufacturing improvement engine 122) may verify aspects of the predictive information by instructing inspection of the wafer. For example, if the predictive information indicates that the thickness of a wafer is not within an acceptable range, MES 132 may instruct one or more of manufacturing tools 140 to scan the thickness of the wafer and determine whether the prediction as accurate. If the prediction was accurate, corrective action may be taken (e.g., initiated manually by a professional or automatically by MES 132). If the prediction is inaccurate, manufacturing improvement engine 122 may store this information as a reference point for future predictive determinations.

Figure 4:
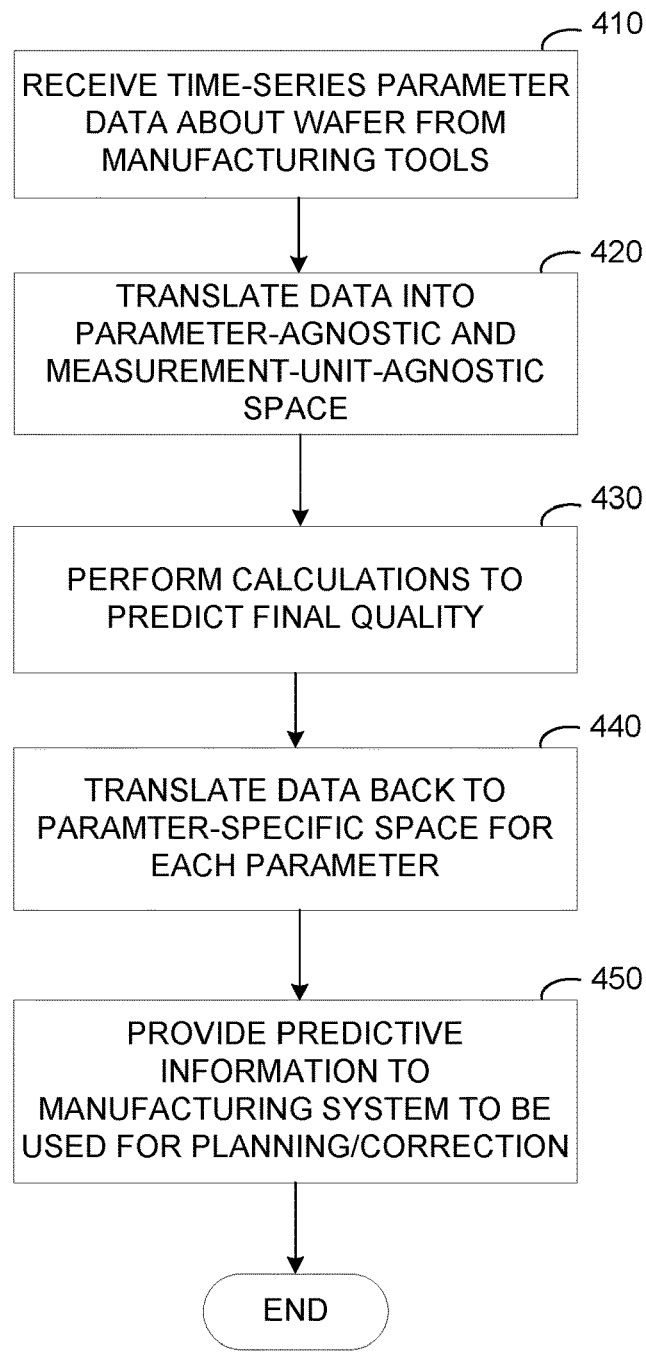
FIG. 4 further illustrates example operations for improving silicon wafer manufacturing according to embodiments of the present disclosure.

FIG. 4 illustrates example operations 400 for improving manufacturing of silicon wafers, according to embodiments of the present disclosure. Operations 400 may be performed, for example, by manufacturing improvement engine 122.

At 410, manufacturing improvement engine 122 receives time-series data representing the behavior of a variety of parameters of a wafer and of manufacturing tools throughout the manufacturing process. Time series data may, for example, comprise a plurality of vectors. For example, manufacturing improvement engine 122 may receive information from MES 132, acquired from one or manufacturing tools 140, about parameters related to the manufacturing of a wafer (e.g., tool parameters, thickness, optical reflective index, absorption index, strength, overlay and alignment data, critical dimension variation across the wafer, and the like). In another embodiment, manufacturing improvement engine 122 receives the data directly from manufacturing tools 140.

At 420, manufacturing improvement engine 122 translates the data received at 410 into a parameter-agnostic and measurement-unit-agnostic space. For example, manufacturing improvement engine 122 may perform a transformation on relative differences to convert the time-series data from its original format (sometimes referred to as n-dimensional space) into a generic space or format which is not tied to any particular parameter or unit of measure (sometimes referred to as k-dimensional space). This allows for correlations to be identified between parameters which may be measured in different units.

At 430, manufacturing improvement engine 122 performs calculations in order to predict the final wafer quality. For example, manufacturing improvement engine 122 may identify correlations between different parameters and use statistical processes or stochastic-based analyses in order to predict the final quality of the wafer with respect to the parameters.

At 440, manufacturing improvement engine 122 translates the predicted final values of the parameters back into the original parameter-specific space or format (e.g., from k-space back to n-space). This allows for the final predicted parameter values to be understood in their proper format.

At 450, manufacturing improvement engine 122 provides the predictive information to MES 132 to be used for analysis and/or corrective action. As described above, predictive information may include information about corrective action to be taken, and MES 132 may perform corrective action automatically. In some embodiments, the predictive information is provided to professionals for evaluation.

Figure 5:
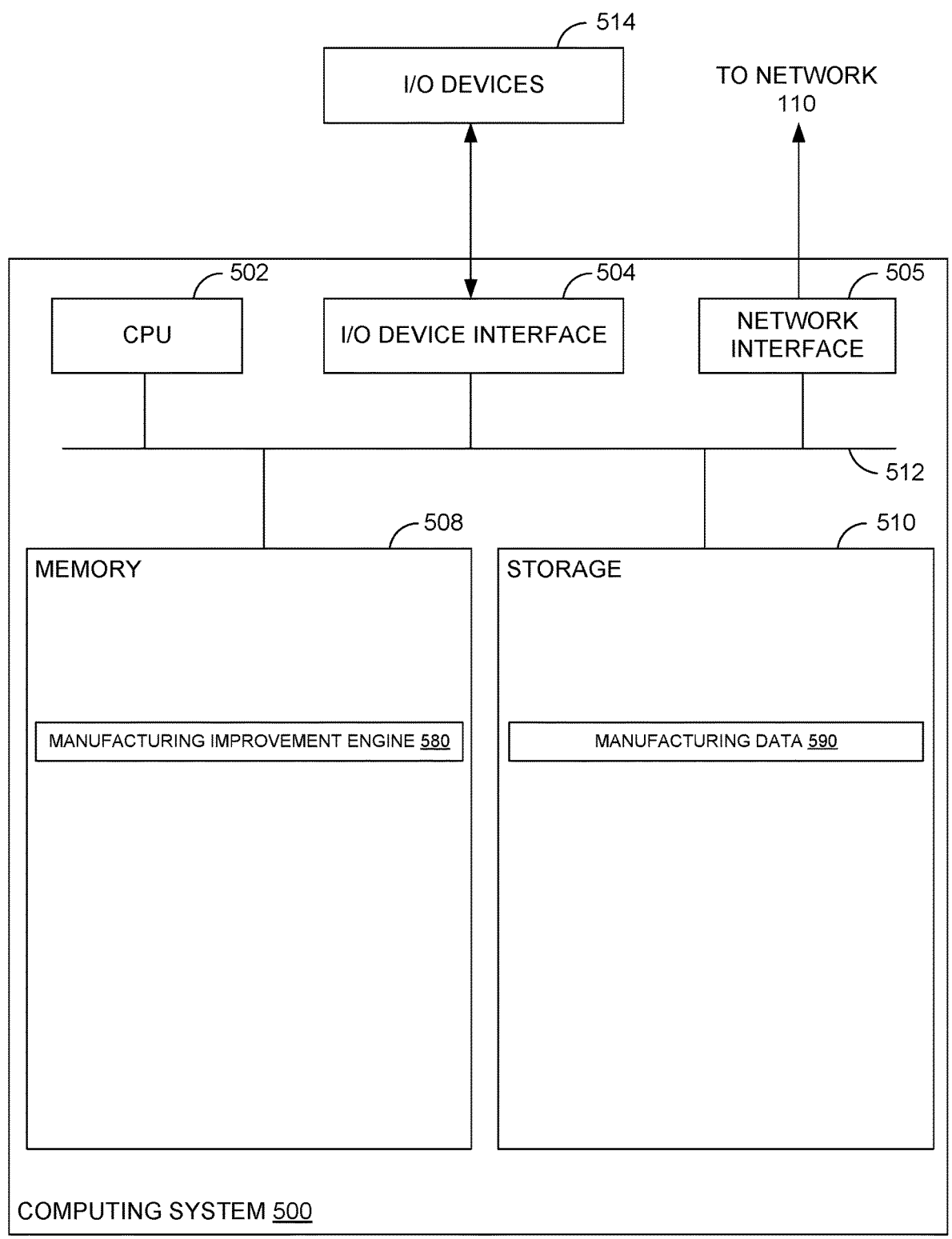
FIG. 5 depicts an example computer system with which embodiments of the present disclosure may be implemented.

FIG. 5 illustrates an example computing system 500 used to improve manufacturing of silicon wafers, according to some embodiments of the present disclosure. In certain embodiments, computer system 500 is representative of a server 120. Aspects of computer system 500 may also be representative of other devices used to perform techniques described herein (e.g., server 130).

As shown, the computing system 500 includes, without limitation, a central processing unit (CPU) 505, a network interface 515, a memory 520, and storage 530, each connected to a bus 517. The computing system 500 may also include an I/O device interface 510 connecting I/O devices 512 (e.g., keyboard, display and mouse devices) to the computing system 500. Further, the computing elements shown in computing system 500 may correspond to a physical computing system (e.g., a system in a data center) or may be a virtual computing instance executing within a computing cloud.

The CPU 505 retrieves and executes programming instructions stored in the memory 520 as well as stored in the storage 530. The bus 517 is used to transmit programming instructions and application data between the CPU 505, I/O device interface 510, storage 530, network interface 515, and memory 520. Note, CPU 505 is included to be representative of a single CPU, multiple CPUs, a single CPU having multiple processing cores, and the like, and the memory 520 is generally included to be representative of a random access memory. The storage 530 may be a disk drive or flash storage device. Although shown as a single unit, the storage 530 may be a combination of fixed and/or removable storage devices, such as fixed disc drives, removable memory cards, optical storage, network attached storage (NAS), or a storage area-network (SAN).

Illustratively, the memory 520 includes a manufacturing improvement engine 580, which performs operations related to improving manufacturing of silicon wafers, according to techniques described herein. For example, manufacturing improvement engine 580 may be equivalent to manufacturing improvement engine 122 in FIG. 1, and may use fundamental statistical processes and stochastic-based analyses of data captured during wafer manufacturing to make predictive determinations regarding wafer quality and other aspects of the manufacturing process.

Illustratively, the storage 520 includes manufacturing data 590, which may comprise information acquired by manufacturing improvement engine 580. Manufacturing data 590 may, for example, comprise information received from MES 132, collected by manufacturing tools 140, related to various parameters of wafers and tools over time during the manufacturing processes (e.g., tool parameters, thickness, optical reflective index, absorption index, strength, overlay and alignment data, critical dimension variation across the wafer, and the like).

Advantageously, the techniques presented herein allow for intelligent predictions of wafer quality based on manufacturing data, and allow for efficient decisions to be made regarding corrective actions to be taken with respect to individual wafers and other aspects of the manufacturing process. Use of embodiments of the present disclosure may reduce costs, improve efficiency, and allow for better strategic planning with respect to the manufacturing process.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples a computer readable storage medium include: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the current context, a computer readable storage medium may be any tangible medium that can contain, or store a program.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

The invention claimed is:

1. A method for improving silicon wafer manufacturing, comprising:
receiving time-series data from one or more manufacturing tools about a manufacturing process of a silicon wafer;
converting the time-series data from a parameter-specific and measurement unit-specific space comprising a first number of dimensions into a parameter-agnostic and measurement unit-agnostic space comprising a second number of dimensions to produce converted data;
determining, based on the converted data, predictive information about a quality of the silicon wafer;
providing the predictive information to a manufacturing system, wherein the predictive information is used to determine whether to take corrective action.

2. The method of claim 1, wherein the predictive information is determined using stochastic modeling.

3. The method of claim 1, wherein the time-series data comprises information about behavior of one or more parameters.

4. The method of claim 1, wherein the predictive information comprises information about at least one of: a thickness, an optical reflective index, an absorption index, a strength, and a critical dimension variation across the silicon wafer.

5. The method of claim 1, further comprising:
providing the predictive information to a metrology tool, wherein the metrology tool checks for a problem based on the predictive information.

6. The method of claim 1, wherein determining the predictive information further comprises converting a result of one or more calculations back into the parameter-specific and measurement unit-specific space.

7. A computing system, comprising:
a memory; and
a processor configured to perform a method for improving silicon wafer manufacturing, the method comprising:
receiving time-series data from one or more manufacturing tools about a manufacturing process of a silicon wafer;
converting the time-series data from a parameter-specific and measurement unit-specific space comprising a first number of dimensions into a parameter-agnostic and measurement unit-agnostic space comprising a second number of dimensions to produce converted data;
determining, based on the converted data, predictive information about a quality of the silicon wafer;
providing the predictive information to a manufacturing system, wherein the predictive information is used to determine whether to take corrective action.

8. The computing system of claim 7, wherein the predictive information is determined using stochastic modeling.

9. The computing system of claim 7, wherein the time-series data comprises information about behavior of one or more parameters.

10. The computing system of claim 7, wherein the predictive information comprises information about at least one of: a thickness, an optical reflective index, an absorption index, a strength, and a critical dimension variation across the silicon wafer.

11. The computing system of claim 7, wherein the method further comprises:
providing the predictive information to a metrology tool, wherein the metrology tool checks for a problem based on the predictive information.

12. The computing system of claim 7, wherein determining the predictive information further comprises converting a result of one or more calculations back into the parameter-specific and measurement unit-specific space.

13. A non-transitory computer-readable medium comprising instructions that when executed by a computing device cause the computing device to perform a method for improving silicon wafer manufacturing, the method comprising:
receiving time-series data from one or more manufacturing tools about a manufacturing process of a silicon wafer;
converting the time-series data from a parameter-specific and measurement unit-specific space comprising a first number of dimensions into a parameter-agnostic and measurement unit-agnostic space comprising a second number of dimensions to produce converted data;
determining, based on the converted data, predictive information about a quality of the silicon wafer;
providing the predictive information to a manufacturing system, wherein the predictive information is used to determine whether to take corrective action.

14. The non-transitory computer-readable medium of claim 13, wherein the predictive information is determined using stochastic modeling.

15. The non-transitory computer-readable medium of claim 13, wherein the time-series data comprises information about behavior of one or more parameters.

16. The non-transitory computer-readable medium of claim 13, wherein the predictive information comprises information about at least one of: a thickness, an optical reflective index, an absorption index, a strength, and a critical dimension variation across the silicon wafer.

17. The non-transitory computer-readable medium of claim 13, wherein the method further comprises:
providing the predictive information to a metrology tool, wherein the metrology tool checks for a problem based on the predictive information.

18. The non-transitory computer-readable medium of claim 13, wherein determining the predictive information further comprises converting a result of one or more calculations back into the parameter-specific and measurement unit-specific space.

* * * * *